US006990645B2

(12) United States Patent
Lichtensteiger et al.

(10) Patent No.: US 6,990,645 B2
(45) Date of Patent: Jan. 24, 2006

(54) METHOD FOR STATIC TIMING VERIFICATION OF INTEGRATED CIRCUITS HAVING VOLTAGE ISLANDS

(75) Inventors: Susan K. Lichtensteiger, Essex Junction, VT (US); Phillip P. Normand, Williston, VT (US); Timothy M. Platt, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 471 days.

(21) Appl. No.: 10/249,661

(22) Filed: Apr. 29, 2003

(65) Prior Publication Data

US 2004/0221252 A1 Nov. 4, 2004

(51) Int. Cl.
*G06F 17/50* (2006.01)
(52) U.S. Cl. .......................................... 716/6
(58) Field of Classification Search ............... 716/6
See application file for complete search history.

(56) References Cited

U.S. PATENT DOCUMENTS

| 4,263,651 A | 4/1981 | Donath et al. ............ 364/300 |
| 5,365,463 A | 11/1994 | Donath et al. ............ 364/578 |
| 5,396,435 A | 3/1995 | Ginetti ..................... 364/489 |
| 5,426,591 A | 6/1995 | Ginetti et al. ............. 364/489 |
| 5,461,576 A | 10/1995 | Tsay et al. ................. 364/490 |
| 5,666,290 A | 9/1997 | Li et al. .................... 364/491 |
| 6,090,150 A | 7/2000 | Tawada ..................... 703/19 |
| 6,134,191 A | 10/2000 | Alfke ........................ 368/118 |
| 6,233,724 B1 | 5/2001 | LaBerge ................... 716/18 |
| 6,272,668 B1 | 8/2001 | Teene |
| 6,883,152 B2 * | 4/2005 | Bednar et al. ............. 716/5 |
| 2004/0039997 A1 * | 2/2004 | Chiang et al. ............. 716/1 |
| 2004/0054975 A1 * | 3/2004 | Yee et al. .................. 716/6 |
| 2004/0133865 A1 * | 7/2004 | Fry et al. .................. 716/6 |

FOREIGN PATENT DOCUMENTS

| JP | 2001057387 | | 2/2001 |
| JP | 2002215706 A | * | 8/2002 |

OTHER PUBLICATIONS

Cheng et al., Use of "Slack " as a Measurement of Being Time and the Procedure for Calculating Slack, IBM Technical Disclosure Bulletin, vol. 25, No. 6, Nov. 1982., pp. 2826-2830.

* cited by examiner

*Primary Examiner*—Stacy A. Whitmore
(74) *Attorney, Agent, or Firm*—Schmeiser, Olsen & Watts; Richard M. Kotulak

(57) ABSTRACT

A method of analysis of an integrated circuit design having multiple voltage islands, including: (a) determining a clock path through the voltage islands; (b) determining a data path through the voltage islands; (c) determining which voltage islands are independent voltage islands; (d) determining which voltage islands are dependent voltage islands; (e) for the data path and the clock path, performing a worst case static timing analysis based on minimum and maximum operating voltages of each independent and dependent voltage island in the data and clock paths; and (f) for the data path and the clock path, performing a best case static timing analysis based on minimum and maximum operating voltages of each independent and dependent voltage island in the data and clock paths.

30 Claims, 7 Drawing Sheets

SETUP & HOLD WORST CASE PROCESS AND TEMPERATURE

| | INDEPENDENT VOLTAGE ISLAND VOLTAGES | DEPENDENT VOLTAGE ISLAND VOLTAGES | | | |
|---|---|---|---|---|---|
| ARRIVAL TIME \ TIMING RUNS | 1, 2, 3 and 4 | 1 | 2 | 3 | 4 |
| DATA PATH | VAmin | VBmax VCmax | VBmax VCmin | VBmin VCmax | VBmin VCmin |
| CLOCK PATH | n.a. | VBmax VCmax | VBmax VCmin | VBmin VCmax | VBmin VCmin |

SETUP = EARLIEST CLOCK - LATEST DATA, HOLD = EARLIEST DATA - LATEST CLOCK
SETUP SLACK1 = CLOCK AT1 - DATA AT1    HOLD SLACK1 = DATA AT1 - CLOCK AT1
SETUP SLACK2 = CLOCK AT2 - DATA AT2    HOLD SLACK2 = DATA AT2 - CLOCK AT2
SETUP SLACK3 = CLOCK AT3 - DATA AT3    HOLD SLACK3 = DATA AT3 - CLOCK AT3
SETUP SLACK4 = CLOCK AT4 - DATA AT4    HOLD SLACK4 = DATA AT4 - CLOCK AT4

*FIG. 4A*

SETUP & HOLD BEST CASE PROCESS AND TEMPERATURE

| | INDEPENDENT VOLTAGE ISLAND VOLTAGES | DEPENDENT VOLTAGE ISLAND VOLTAGES | | | |
|---|---|---|---|---|---|
| ARRIVAL TIME \ TIMING RUNS | 5, 6, 7 and 8 | 5 | 6 | 7 | 8 |
| DATA PATH | VAmax | VBmax VCmax | VBmax VCmin | VBmin VCmax | VBmin VCmin |
| CLOCK PATH | n.a. | VBmax VCmax | VBmax VCmin | VBmin VCmax | VBmin VCmin |

SETUP = EARLIEST CLOCK - LATEST DATA, HOLD = EARLIEST DATA - LATEST CLOCK
SETUP SLACK5 = CLOCK AT5 - DATA AT5    HOLD SLACK5 = DATA AT5 - CLOCK AT5
SETUP SLACK6 = CLOCK AT6 - DATA AT6    HOLD SLACK6 = DATA AT6 - CLOCK AT6
SETUP SLACK7 = CLOCK AT7 - DATA AT7    HOLD SLACK7 = DATA AT7 - CLOCK AT7
SETUP SLACK8 = CLOCK AT8 - DATA AT8    HOLD SLACK8 = DATA AT8 - CLOCK AT8

*FIG. 4B*

METHOD FOR STATIC TIMING VERIFICATION OF INTEGRATED CIRCUITS HAVING VOLTAGE ISLANDS

BACKGROUND OF INVENTION

1. Field of the Invention

The present invention relates to the field of integrated circuits; more specifically, it relates to method for static timing verification of integrated circuits having voltage islands.

2. Background of the Invention

Static timing verification of integrated circuits involves an evaluation of signal propagation at two extremes, fast and slow, of circuit speed. Slow signal propagation occurs at the nexus of worst case process (as deviations in geometry and doping profiles from design), worst case operating temperature (high for complementary metal oxide semiconductor (CMOS)) and minimum allowable operating voltage of the integrated circuit. Fast signal propagation occurs at the nexus of best-case process, best case operating temperature (low for complementary metal oxide semiconductor (CMOS)) and maximum allowable operating voltage of the integrated circuit.

Static timing verification of integrated circuits that contain voltage islands present the problem of exponentially increasing numbers of static timing verification runs required as the number of voltage islands on an integrated circuit increases. To fully verify static timing the fact that any voltage island can be running at best case or worse case voltage conditions independently of all other voltage islands must be taken into account. For any given timing path, $2 \times 2^N$ timing runs will be required, where N is the number of voltage islands. The cost and time required for static timing verification of integrated circuit designs containing multiple voltage islands quickly increases as the number of voltage islands increases and can become prohibitive.

SUMMARY OF INVENTION

A first aspect of the present invention is a method of analysis of an integrated circuit design having multiple voltage islands, comprising: (a) determining a clock path through the voltage islands; (b) determining a data path through the voltage islands; (c) determining which voltage islands are independent voltage islands; (d) determining which voltage islands are dependent voltage islands; (e) for the data path and the clock path, performing a worst case static timing analysis based on minimum and maximum operating voltages of each independent and dependent voltage island in the data and clock paths; and (f) for the data path and the clock path, performing a best case static timing analysis based on minimum and maximum operating voltages of each independent and dependent voltage island in the data and clock paths.

A second aspect of the present invention is a program storage device readable by machine, tangibly embodying a program of instructions executable by the machine to perform method steps for analysis of an integrated circuit design having multiple voltage islands the method steps comprising: (a) determining a clock path through the voltage islands; (b) determining a data path through the voltage islands; (c) determining which voltage islands are independent voltage islands; (d) determining which voltage islands are dependent voltage islands; (e) for the data path and the clock path, performing a worst case static timing analysis based on minimum and maximum operating voltages of each independent and dependent voltage island in the data and clock paths; and (f) for the data path and the clock path, performing a best case static timing analysis based on minimum and maximum operating voltages of each independent and dependent voltage island in the data and clock paths.

A third aspect of the present invention is a computer system comprising a processor, an address/data bus coupled to said processor, and a computer-readable memory unit coupled to communicate with said processor, said memory unit containing instructions that when executed implement a method for analysis of an integrated circuit design having multiple voltage islands, said method comprising the computer implemented steps of: (a) determining a clock path through the voltage islands; (b) determining a data path through the voltage islands; (c) determining which voltage islands are independent voltage islands; (d) determining which voltage islands are dependent voltage islands; (e) for the data path and the clock path, performing a worst case static timing analysis based on minimum and maximum operating voltages of each independent and dependent voltage island in the data and clock paths; and (f) for the data path and the clock path, performing a best case static timing analysis based on minimum and maximum operating voltages of each independent and dependent voltage island in the data and clock paths.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 4A and 4B are charts illustrating the timing run conditions of the method of the present invention as applied to the integrated circuit of FIG. 1;

DETAILED DESCRIPTION

For the purposes of the present invention, a voltage island is defined as a region of an integrated circuit that may be independently powered relative to other regions of the integrated circuit chip or other voltage islands. A voltage island may be nested within another voltage island. The integrated circuit may be considered as the highest-level voltage island in a hierarchy of nested voltage islands. Voltage islands nested within another voltage island are always independently powered relative to the immediately higher voltage island and may be dependently or independently powered from twice or further removed higher-level voltage islands.

Slack is defined as the required arrival time at a endpoint of a circuit path of a clock or data signal minus the arrival time of the clock or data signal at the endpoint. A negative slack time is undesirable. Setup and hold are specific slack cases. Setup is defined as the earliest clock signal arrival time minus the latest data signal arrival time (including guard time) at the endpoint. Hold is defined as a earliest data signal arrival time (including guard time) minus the latest clock signal arrival time at the endpoint.

It should be kept in mind that timing verification is performed by simulation of the design in a general-purpose computer and not by testing hardware. Therefore, it should be understood the word "simulated" should precede or the word "design" follow terms like integrated circuit, voltage island, combinational logic, data path, clock path, latch, start point, intermediate point and endpoint and latch unless otherwise described. However, the present invention is readily extendable to actual testing of timing on an actual physical integrated circuit.

Figure 1:
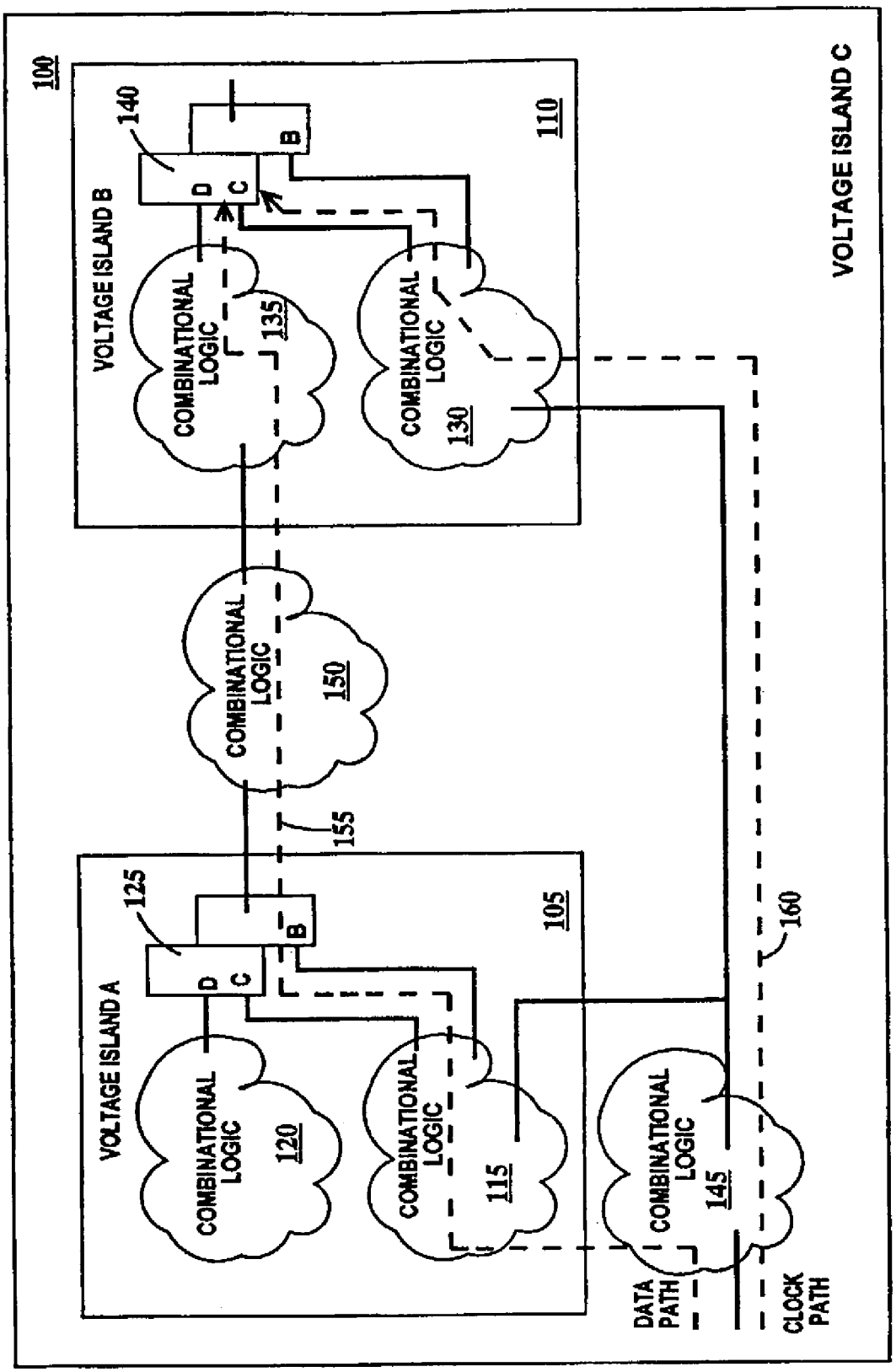
FIG. 1 is schematic diagram of a first exemplary integrated circuit having multiple voltage islands according to the present invention.

FIG. 1 is schematic diagram of a first exemplary integrated circuit having multiple voltage islands according to the present invention. In FIG. 1, integrated circuit 100, designated as voltage island C, includes a first voltage island 105 designated as voltage island A and a second voltage island 110 designated as voltage island B. Note that integrated circuit 100 is itself a voltage island, being the highest-level voltage island in the hierarchy of voltage islands illustrated in FIG. 1. First and second voltages islands 105 and 110 are equal lower level voltage islands in this hierarchy. First voltage island 705 includes combinational logic 115, combinational logic 120 and latch 125. Second voltage island 110 includes combinational logic 130, combinational logic 135 and latch 140. Integrated circuit 100 includes combinational logic 145 and combinational logic 150. While latches 125 and 140 are illustrated in FIG. 1 as latch pairs, the present invention is applicable to other types of latches as well.

Combinational logic 145 is coupled to combinational logic 115 and combinational logic 130. Both combination logic 115 and combinational logic 120 are coupled to latch 125. Both combination logic 130 and combinational logic 135 are coupled to latch 140. Latch 125 is coupled through combinational logic ISOto combinational logic 135.

Consider a data path 155 to be verified having a start point in a clock tree in combinational logic 145. Data path 155 continues to a clock tree in combinational logic 115, which drives data from combinational logic 120 out of latch 125 into combinational logic 150. Data path 155 then continues through combinational logic 135 to latch 140, which is the endpoint of data path 155. Data path 155 propagates through integrated circuit 100, first voltage island 105 and second voltage island 110. As data path 155 is generated by software, tags indicating each voltage island the data path passes through are generated. In the present example, at the endpoint of data path in latch 140, data path 155 would have tags A, B and C associated with the data path, where A represents first voltage island 105, B represents second voltage island 110 and C represents integrated circuit (voltage island C) 100 since the data path passed through voltage island 105 second voltage island 117 and integrated circuit (voltage island C) 100.

Similarly, consider a clock path 160 associated with data path 155. Clock path 160 starts in the same clock tree in combinational logic 145, continues to combinational logic 130 and then to latch 140, the same endpoint as data path 155. As clock path 160 is generated by software, tags indicating each voltage island the clock path passes through are generated. In the present example, at the endpoint of clock path in latch 140, clock path 160 would have tags B and C associated with the clock path since the clock path passed through integrated circuit 100 (voltage island C) and second voltage island 110.

Data path 155 and clock path 160 are comprised of interconnected cells. The delay of a signal in data path 155 or clock path 160 is comprised of internal cell delay and delay in the interconnection (typically wiring delay caused by wire resistance, wire capacitance and/or capacitive coupling between adjacent wires) between cells.

Tags B and C are common to both data path 155 and clock path 160. Tag A only occurs in data path 155. Therefore, first voltage island 105 (voltage island A) is designated as an independent voltage island and second voltage island 110 (voltage island B) and integrated circuit 100 (voltage island C) are designated as dependent voltage islands. Thus, an independent voltage island is defined as a voltage island in which either the data path or the associated clock path pass through, but not both, and a dependent voltage island is defined as a voltage island in which both the data path and the associated clock path pass through. The determination of independent versus dependent voltage island is easily made by reference to the tags attached to the clock and data paths, the tag(s) not appearing in both paths indicate the independent voltage island(s).

Tags allow static timing software to keep track of which voltage islands are involved in a given static timing verification check. Since a given circuit in a given voltage island cannot be operating in both worst case (minimum) voltage and best case (maximum) voltage conditions at the same time, tags allow data signal and clock signal arrival time (at the endpoint) calculations to be performed on a path basis using a subset of all possible combinations of voltage islands at voltage min/max conditions. The actual calculations for data path 155 and clock path 160 illustrated in FIG. 1 are discussed infra in reference to FIG. 3.

Figure 2:
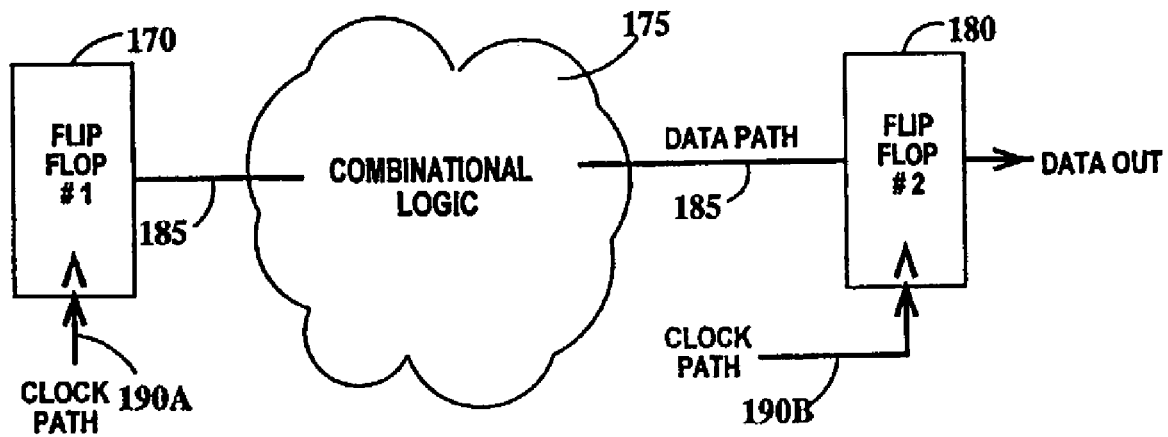
FIG. 2 is a schematic diagram of a portion of an integrated circuit.
Figure 3:
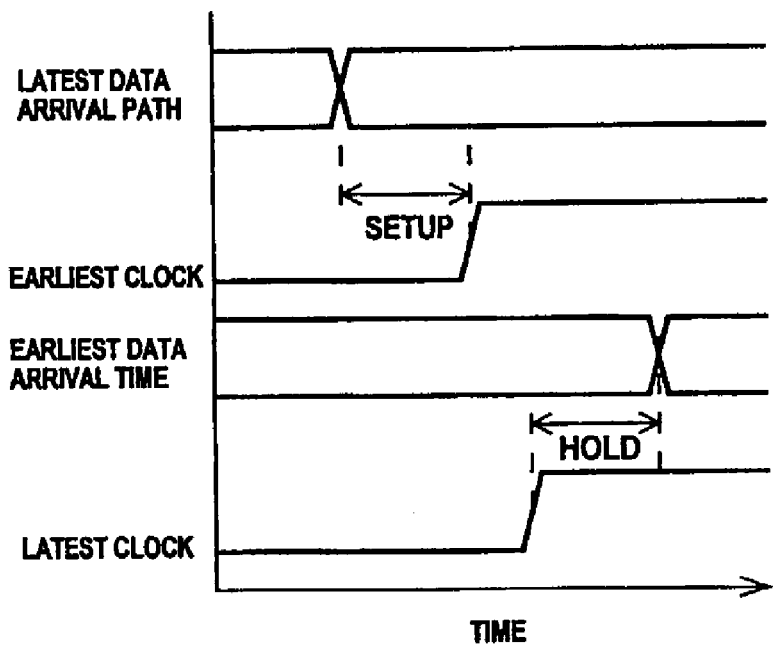
FIG. 3 is a timing diagram of the integrated circuit of FIG. 2.

FIGS. 2 and 3 illustrate the concept of setup and hold. FIG. 2 is a schematic diagram of a portion of an integrated circuit. In FIG. 2, a first flip flop 170 is coupled through combinational logic 175 to a second flip flop 180. First flip flop 170 is the start point of a data path 185 and second flip flop 180 is the endpoint of data path 185. Data is clocked out of first flip flop 170 by a clock signal on clock path 190A. Data is clocked out of second flip flop 180 by a clock signal on clock path 190B. Depending upon the voltage, process and temperature conditions applied to combinational logic 175, flip flops 170 and 180 and corresponding interconnects, a data signal applied to data path 185 may arrive at second flip flop 180 before, at the same time, or after the clock signal applied to clock path 190B arrives at second flip flop 180. While flip flops 170 and 180 are illustrated in FIG. 2, the present invention is applicable to other types of latches as well.

FIG. 3 is a timing diagram of the integrated circuit of FIG. 2. For a slow chip (worst case) static timing simulations, the worst case process and high temperature would be used.

The latest possible rising or falling data arrival time should ideally result in data arriving before the earliest clock changes as shown in the upper portion of FIG. 3. For integrated circuit designs with voltage islands, this latest possible data arrival time is obtained by applying worst case process, high temperature and minimum voltage to combination logic 175 and flip flops 170 and 180 (see FIG. 2). The time difference between the earliest clock signal arrival time and the latest data arrival is setup slack.

The earliest possible rising or falling data arrival time should ideally result in data arriving after the latest clock changes as shown in the lower portion of FIG. 3. For integrated circuit designs with voltage islands, this earliest possible data arrival time is obtained by applying worst case process, high temperature and minimum voltage to combination logic 175 and flip flops 170 and 180 (see FIG. 2). The time difference between the earliest data signal arrival time and the latest clock arrival is hold slack.

For a fast chip (best case) static timing simulations, the best case process and low temperature would be used.

The latest possible rising or falling data arrival time should ideally result in data arriving before the earliest clock changes as shown in the upper portion of FIG. 3. For integrated circuit designs with voltage islands, this latest possible data arrival time is obtained by applying best case process, low temperature and maximum voltage to combination logic 175 and flip flops 170 and 180 (see FIG. 2). The time difference between the earliest clock signal arrival time and the latest data arrival is setup slack.

The earliest possible rising or falling data arrival time should ideally result in data arriving after the latest clock changes as shown in the lower portion of FIG. 3. For integrated circuit designs with voltage islands, this earliest possible data arrival time is obtained by applying best case process, low temperature and maximum voltage to combination logic 175 and flip flops 170 and 180 (see FIG. 2). The time difference between the earliest data signal arrival time and the latest clock arrival is hold slack.

Setup and hold must each be within specified limits for a robust integrated circuit design.

FIGS. 4A and 4B are charts illustrating the timing run conditions of the method of the present invention as applied to the integrated circuit of FIG. 1. In FIGS. 4A and 4B VA is the operating voltage of voltage island A (first voltage island 105 of FIG. 1), VB is the operating voltage of voltage island B (second voltage island 110 of FIG. 1), and VC is the voltage applied to voltage island C (integrated circuit 100 of FIG. 1). The only independent voltage island is voltage island A.

FIG. 4A illustrates the number of timing verification runs and the conditions required to determine the worst case setup and worst case hold for data path 155 and clock path 160 of FIG. 1. Worst case setup and hold verification runs always uses worst case process and temperature. Voltage island operating voltages, however, may be worst case (minimum voltage) or best case (maximum voltage). The arrival time of a data signal on data path 155 is effected by the operating voltages of voltage islands A, B and C. The arrival time of a clock signal on clock path 160 is effected by the operating voltages of voltage islands B and C. For worst case, timing verification must be run using only worst case voltage applied to voltage island A (VAmin), the independent voltage island. However, timing verification must be run using both worst case and best case voltages applied to voltage islands B and C (VBmin, VBmax, VCmin, VCmax), the dependent voltage islands, since it is unknown how interaction between dependent voltage islands contributes to the overall delay through the entire path. Since there are four possible combinations of VBmin, VBmax, VCmin, VCmax, four worst case timing simulations must be run. For the first timing run, the voltage of voltage islands A, B and C are set to VAmin, VBmax and VCmax respectively. For the second timing run, the voltage of voltage islands A, B and C are set to VAmin, VBmax and VCmin respectively. For the third timing run, the voltage of voltage islands A, B and C are set to VAmin, VBmin and VCmax respectively. For the fourth timing run, the voltage of voltage islands A, B and C are set to VAmin, VBmin and VCmin respectively.

For each timing run, the arrival time of the data signal and the clock signal at the path endpoint must be determined, thus there are four data arrival times, DATA AT1, DATA AT2, DATA AT3 and DATA AT4 and four corresponding clock arrival times CLOCK AT1, CLOCK AT2, CLOCK AT3 and CLOCK AT4. Therefore, four setup slacks (SETUP SLACK1=CLOCK AT1−DATA AT1, SETUP SLACK2=CLOCK AT2−DATA AT2, SETUP SLACK3=CLOCK AT3−DATA AT3, SETUP SLACK4=CLOCK AT4−DATA AT4) and four hold slacks (HOLD SLACK1=DATA AT1−CLOCK AT1, HOLD SLACK2=DATA AT2−CLOCK AT2, HOLD SLACK3=DATA AT3−CLOCK AT3, HOLD SLACK4=DATA AT4−CLOCK AT4) may be calculated as illustrated in FIG. 4A. Without the analysis of dependent and independent voltage islands, four additional timing runs, using a voltage of VAmax, and combinations of VBmin, VBmax, VCmin and VCmax in combination with worst case process and worst case temperature would have to be run.

FIG. 4B illustrates the number of timing verification runs and the conditions required to determine the best case setup and best case hold for data path 155 and clock path 160 of FIG. 1. Best case setup and hold verification runs always uses best case process and temperature. Voltage island operating voltages, however, may be worst case (minimum voltage) or best case (maximum voltage). The arrival time of a data signal on data path 155 is affected by the operating voltages of voltage islands A, B and C. The arrival time of a clock signal on clock path 160 is affected by the operating voltages of voltage islands B and C. For best case, timing verification need be run using only best case voltage applied to voltage island A (VAmax), the independent voltage island. However, timing verification must be run using both worst case and best case voltages applied to voltage islands B and C (VBmin, VBmax, VCmin, VCmax), the dependent voltage islands, since it is unknown how interaction between dependent voltage islands contributes to the overall delay through the entire path. Since there are four possible combinations of VBmin, VBmax, VCmin, VCmax, four best case timing simulations must be run. For the first timing run, the voltage of voltage islands A, B and C are set to VAmax, VBmax and VCmax respectively. For the second timing run, the voltage of voltage islands A, B and C are set to VAmax, VBmax and VCmin respectively. For the third timing run, the voltage of voltage islands A, B and C are set to VAmax, VBmin and VCmax respectively. For the fourth timing run, the voltage of voltage islands A, B and C are set to VAmax, VBmin and VCmin respectively.

For each timing run, the arrival time of the data signal and the clock signal at the path endpoint must be determined, thus there are four data arrival times, DATA AT5, DATA AT6, DATA AT7 and DATA AT8 and four corresponding clock arrival times CLOCK AT5, CLOCK AT6, CLOCK AT7 and CLOCK AT8. Therefore, four setup slacks (SETUP SLACK5=CLOCK AT5−DATA AT5, SETUP SLACK6=CLOCK AT6−DATA AT6, SETUP SLACK7=CLOCK AT7−DATA AT7, SETUP SLACK8=CLOCK AT8−DATA AT8) and four hold slacks (HOLD SLACK5=DATA AT5−CLOCK AT5, HOLD SLACK6=DATA AT6−CLOCK AT6, HOLD SLACK7=DATA AT7−CLOCK AT7, HOLD SLACK8=DATA AT8−CLOCK AT8) may be calculated as illustrated in FIG. 4B. Without the analysis of dependent and independent voltage islands, four additional timing runs, using a voltage of VAmin and combinations of VBmin, VBmax, VCmin and VCmax in combination with best case process and best case temperature would have to be run.

Figure 5:
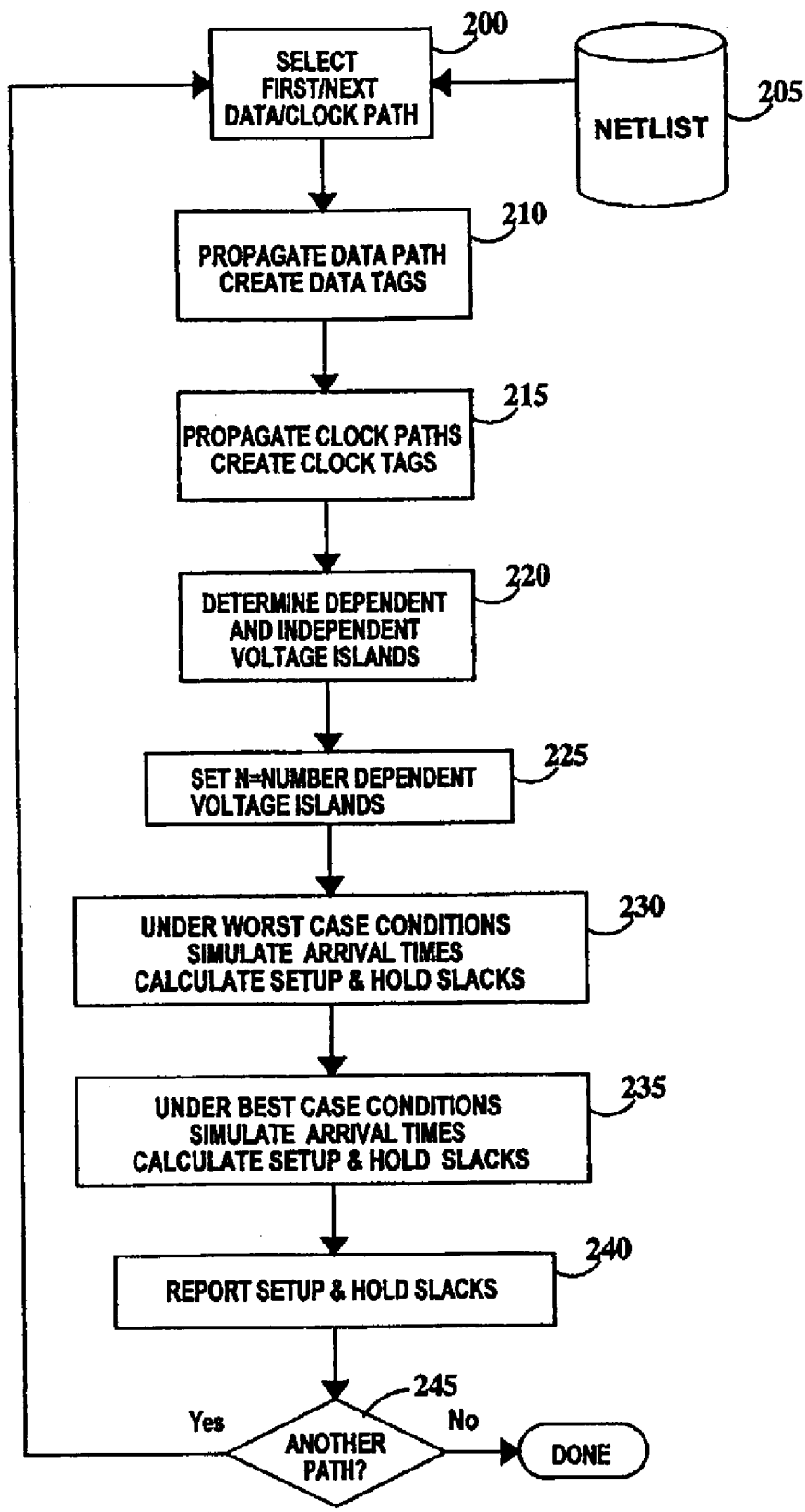
FIGS. 5, 6 and 7 are flowcharts illustrating the method of the present invention for static timing verification of integrated circuit designs according to the present invention.
Figure 6:
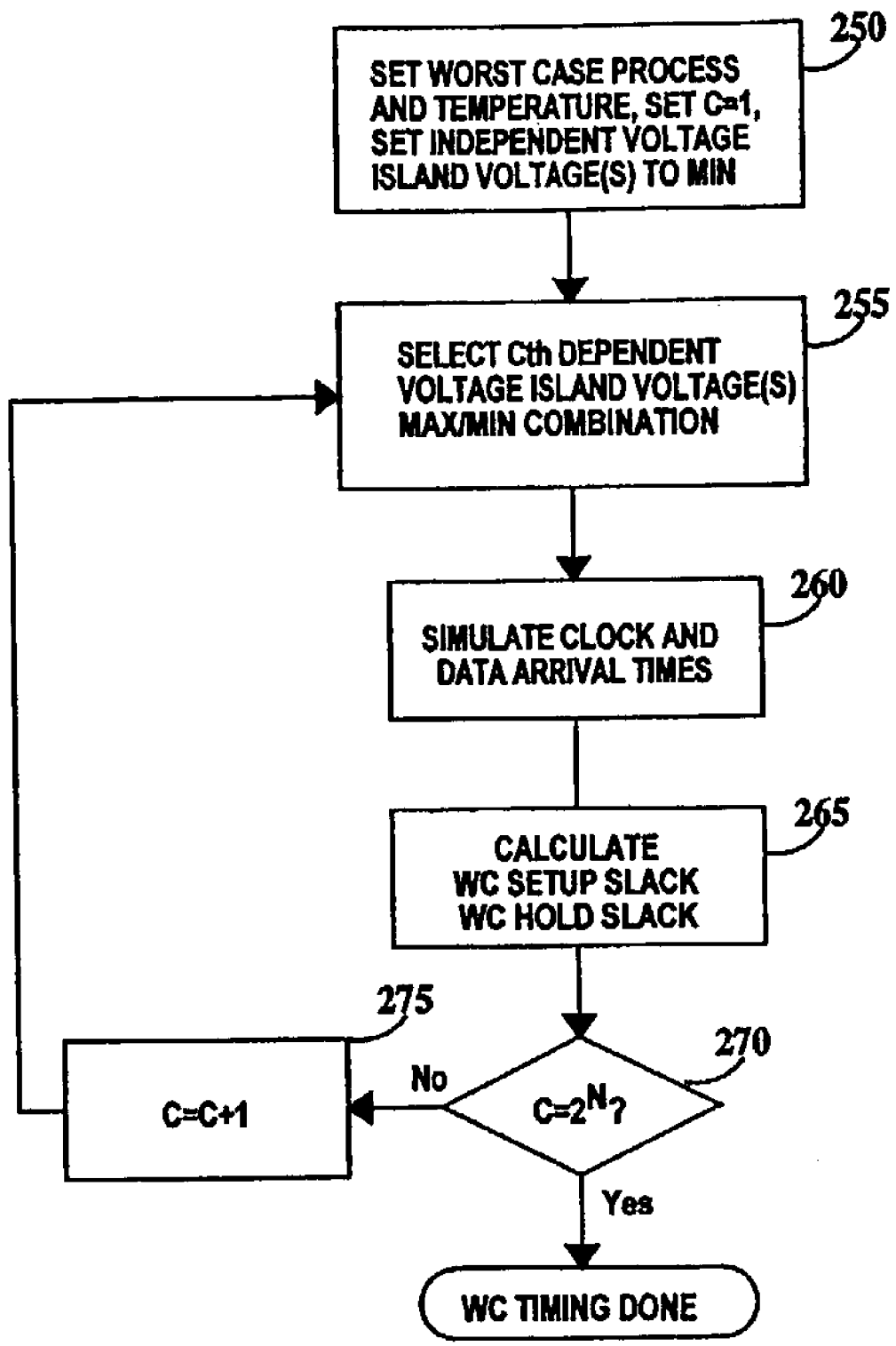
Figure 7:
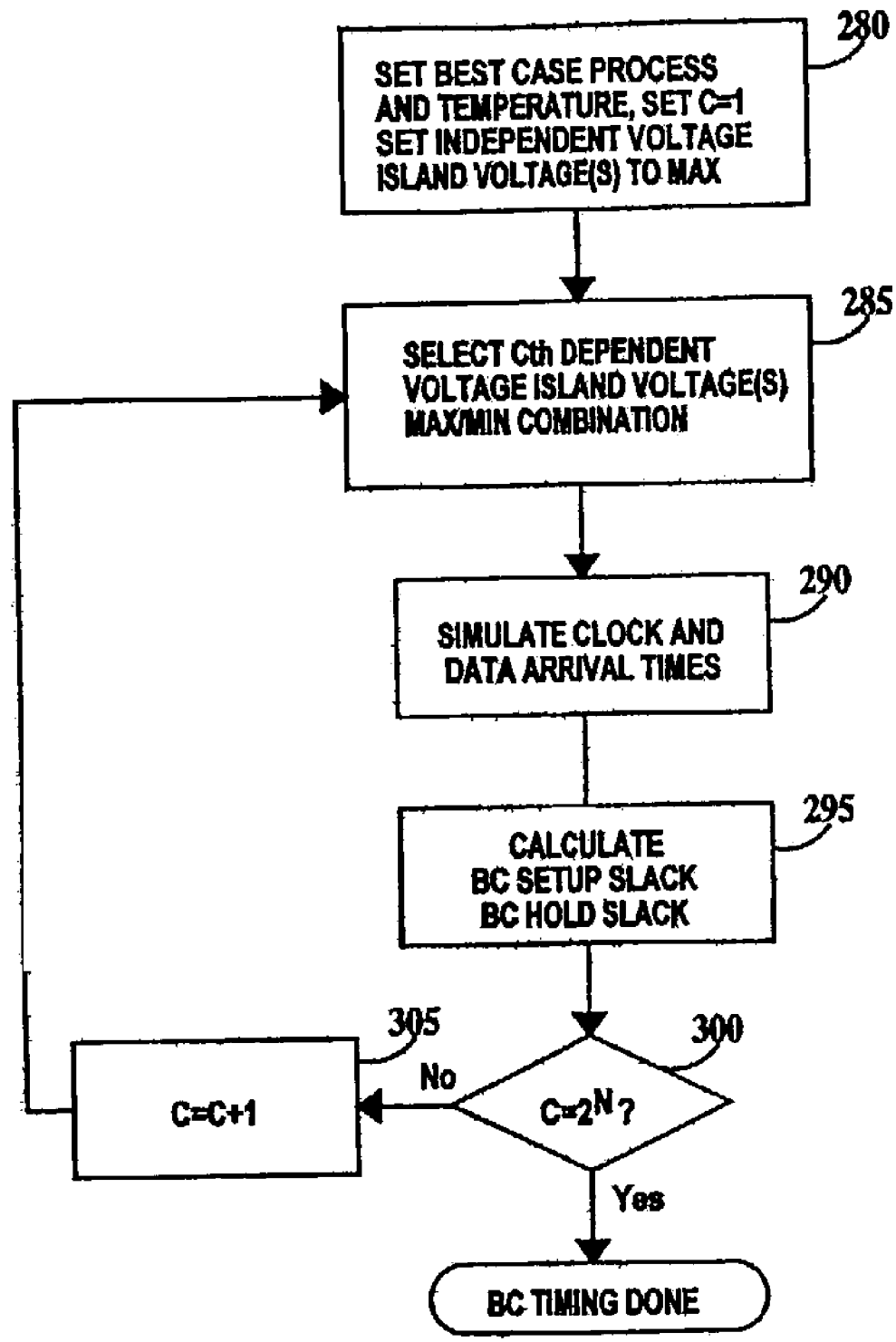

FIGS. 5, 6 and 7 are flowcharts illustrating the method of the present invention for static timing verification of integrated circuit designs according to the present invention. In step 200, the first (or next) data/clock path combination for static timing verification is selected from netlist 205 of the integrated circuit design. A netlist is a list of cells in an integrated circuit and a set of nodes interconnecting the cells, each cell having at least one input and one output. In step 210, the data path is propagated and data path voltage island tags created. In step 215, the corresponding clock path is propagated and clock path voltage island tags created. In step 220, the independent voltage islands and dependent voltage islands in the data and clock path are determined as discussed supra. In step 225, N is set equal to the number of dependent voltage island. In step 230, using worst case conditions, data and clock arrival times are simulated and setup and hold slacks calculated. Step 230 is more fully described infra in reference to FIG. 6. In step 235, using best case conditions, data and clock arrival times are simulated and setup and hold slacks calculated. Step 235 is more fully described infra in reference to FIG. 7. In step 240, the setup and hold slacks are reported. In step 245, it is determined if there is another data path/clock path combination to be static timing verified. If, in step 245, there is another data path/clock path combination to be static timing verified then the method loops to step 200, otherwise the method terminates.

FIG. 6, illustrates additional steps performed within step 230 of FIG. 5. In step 250, a counter C is set to one, process is set to worse case, temperature set to worse case and the voltages on all independent voltage islands set to a minimum voltage. While the example of FIG. 1 has only one independent island, data path/clock path combinations may have more than one independent voltage island. island. (It is possible to have a single dependent voltage island as well).

In step 255, the $C^{th}$ dependent voltage island minimum/maximum voltage island combination is selected. Since there are N dependent voltage islands, each being at a maximum or a minimum voltage, there are $2^N$ combinations of voltage island voltages. In the example of FIG. 1, N=2, so there were 4 combinations.

In step 260, data and clock arrival times are simulated using worst case process, worst case temperature, the minimum independent voltage island voltage and the $C^{th}$ combination of dependent voltage island voltages. Generally, worst case process and temperature delay at minimum and at maximum voltage are expressed as equations for each cell and its interconnects in the data or clock path into which the appropriate process parameter(s), temperature and voltage may be plugged. The sum of the evaluation of each equation corresponding to a cell and its interconnects in the data or clock path is the arrival time of the data or clock signal at the common endpoint of the paths. As stated supra, the arrival time may also include delay caused by the interconnections between cells. A cell may be an individual device such as a transistor, diode, resistor or capacitor or a more complex device comprised of multiple transistors, diodes, capacitors or resistors.

In step 265, a setup slack and a hold slack is calculated as described supra. In step 270 it is determined if $C=2^N$ (i.e. was the last dependent voltage island voltage combination used in the previous steps). If in step 270, C is not equal to $2^N$, then the method proceeds to step 275, where C is incremented by one and the method then loops to step 255. If in step 270, C is equal to $2^N$, the worst case portion of static timing is complete.

FIG. 7, illustrates additional steps performed within step 235 of FIG. 5. In step 280, the counter C is reset to 1, process is set to best case, temperature set to best case and the voltages on all independent voltage islands set to a maximum voltage. While the example of FIG. 1 has only one independent island, data path/clock path combinations may have more than one independent voltage island. island. (It is possible to have a single dependent voltage island as well).

In step 285, the $C^{th}$ dependent voltage island minimum/maximum voltage island combination is selected. Since there are N dependent voltage islands, each being at a maximum or a minimum voltage, there are $2^N$ combinations of voltage island voltages. In the example of FIG. 1, N=2, so there were 4 combinations.

In step 290, data and clock arrival times are simulated using best case process, best case temperature, the maximum independent voltage island voltage and the $C^{th}$ combination of dependent voltage island voltages. Generally, best case process and temperature delay at minimum and at maximum voltage are expressed as equations for each cell and its interconnects in the data or clock path into which the appropriate process parameter(s), temperature and voltage may be plugged. The sum of the evaluation of each equation corresponding to a cell and its interconnects in the data or clock path is the arrival time of the data or clock signal at the common endpoint of the paths.

In step 295, a setup slack and a hold slack is calculated as described supra. In step 300 it is determined if $C=2^N$ (i.e. was the last dependent voltage island voltage combination used in the previous steps). If in step 300, C is not equal to $2^N$, then the method proceeds to step 305, where C is incremented by one and the method then loops to step 285. If in step 300, C is equal to $2^N$, the best case portion of static timing is complete.

Figure 8:
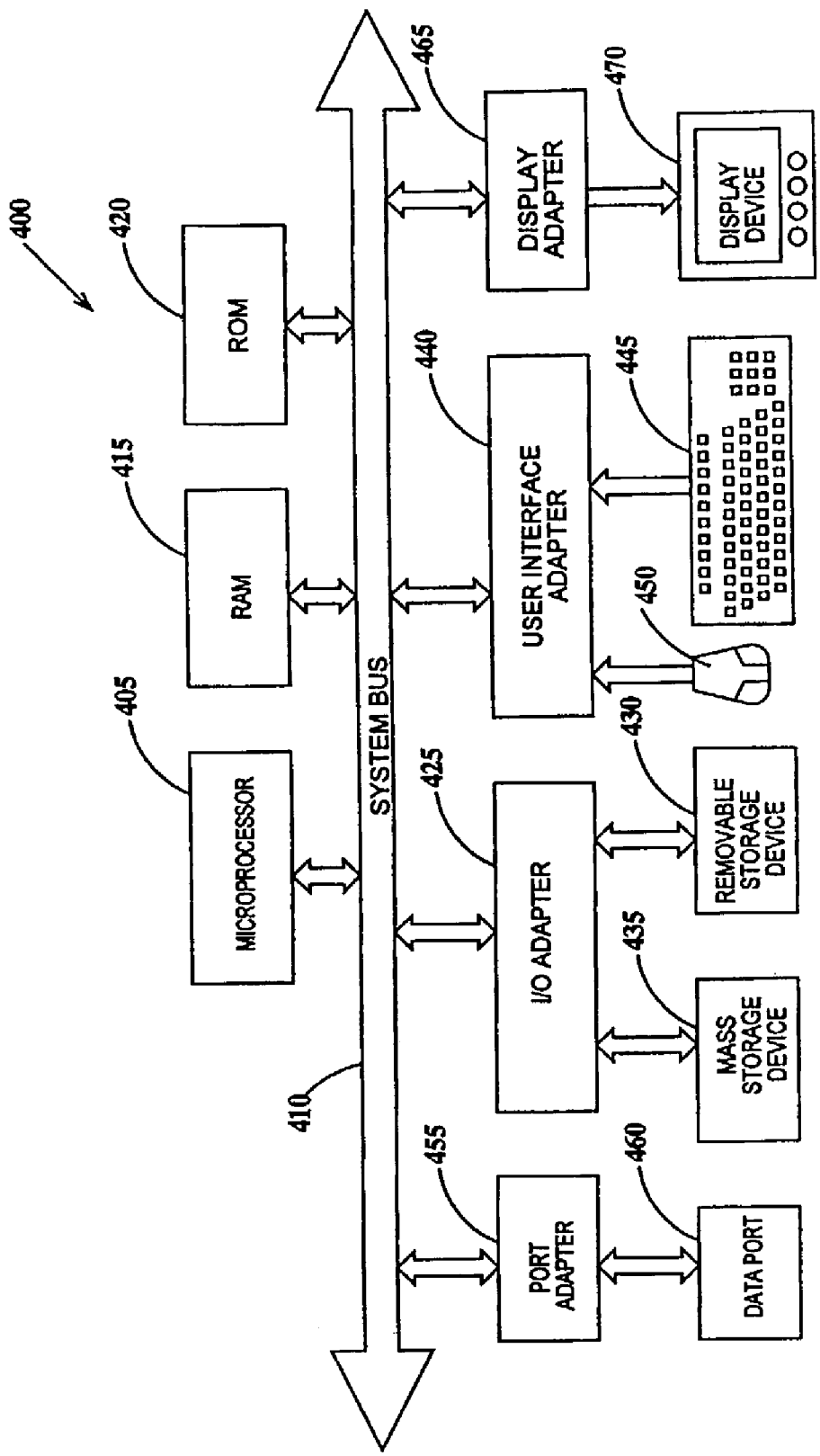
FIG. 8 is a schematic block diagram of a general-purpose computer for practicing the present invention.

Generally, the method described herein with respect to static timing verification of integrated circuit designs containing voltage islands is practiced with a general-purpose computer and the method may be coded as a set of instructions on removable or hard media for use by the general-purpose computer. FIG. 8 is a schematic block diagram of a general-purpose computer for practicing the present invention. In FIG. 8, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method of analysis of an integrated circuit design having multiple voltage islands, comprising:
   (a) determining a clock path through said voltage islands;
   (b) determining a data path through said voltage islands;
   (c) determining which said voltage islands are independent voltage islands;
   (d) determining which said voltage islands are dependent voltage islands;
   (e) for said data path and said clock path, performing a worst case static timing analysis based on minimum and maximum operating voltages of each independent and dependent voltage island in said data and clock paths; and
   (f) for said data path and said clock path, performing a best case static timing analysis based on minimum and maximum operating voltages of each independent and dependent voltage island in said data and clock paths.

2. The method of claim 1, wherein:
   said independent voltage islands are voltage islands that only one of said clock path or said data path passes through; and
   said dependent voltage islands being voltage islands that both said clock path and said data path passes through.

3. The method of claim 1, wherein:
   said worst case timing analysis is based on worst case conditions applied to all voltage islands, the minimum operating voltage applied to said independent voltage islands, and every combination of respective minimum and maximum operating voltages applied to each dependent voltage island; and
   said best case timing analysis is based on best case conditions applied to all voltage islands, the maximum operating voltage applied to said independent voltage islands and every combination of respective minimum and maximum operating voltages applied to each dependent voltage island.

4. The method of claim 3, wherein said worst case and said best case conditions are selected from conditions selected from the group consisting of process conditions, temperature conditions and both process and temperature conditions.

5. The method of claim 4, wherein said worst and best case process conditions are a function of the geometry and the doping of devices comprising said integrated circuit and said worst case temperature conditions are maximum operating temperatures of said integrated circuit and said best case temperature conditions are minimum operating temperatures of said integrated circuit.

6. The method of claim 1, further including determining an arrival time of a clock signal applied to a start point of said clock path at a common endpoint of said clock and data paths and determining an arrival time of a data signal applied at a start point of said data path at said common endpoint of said clock and data paths for each static timing analysis performed in steps (e) and (f).

7. The method of claim 6, further including calculating setup slacks and hold slacks based on said arrival times of said clock and data signals at said common endpoint of said clock and data paths.

8. The method of claim 6, wherein said arrival times of said clock and data signals are based on delays through cells in said clock and data paths respectively.

9. The method of claim 8, wherein said arrival times of said clock and data signals are further based on delays between cells in said clock and data paths respectively.

10. The method of claim 1, wherein said signal path and said data path are determined from a netlist comprising a list of cells in said integrated circuit and a set of nodes interconnecting said cells, each cell having at least one input and one output.

11. The method of claim 1, further including;
    during step (a) creating a set of clock path voltage island tags for said clock path, said set of clock voltage island tags indicating each voltage island said clock path passes through;
    during step (b) creating a set of data path voltage island tags for said data path, said set of data voltage island tags indicating each voltage island said data path passes through; and
    during steps (c) and (d) using said set of clock voltage island tags and said set of data voltage island tags to determine which voltage islands of said integrated circuit are independent voltage islands and which voltage islands of said set of integrated circuit are dependent voltage islands by comparing said set of clock voltage island tags and said set of data voltage island tags.

12. The method of claim 1, wherein step (a) includes determining all cells and their interconnections in said clock path and step (b) includes determining all cells and their interconnections in said data path.

13. A program storage device readable by machine, tangibly embodying a program of instructions executable by the machine to perform method steps for analysis of an integrated circuit design having multiple voltage islands said method steps comprising:
    (a) determining a clock path through said voltage islands;
    (b) determining a data path through said voltage islands;
    (c) determining which said voltage islands are independent voltage islands;
    (d) determining which said voltage islands are dependent voltage islands;
    (e) for said data path and said clock path, performing a worst case static timing analysis based on minimum and maximum operating voltages of each independent and dependent voltage island in said data and clock paths; and
    (f) for said data path and said clock path, performing a best case static timing analysis based on minimum and maximum operating voltages of each independent and dependent voltage island in said data and clock paths.

14. The program storage device of claim 13, wherein:
    said independent voltage islands are voltage islands that only one of said clock path or said data path passes through; and
    said dependent voltage islands being voltage islands that both said clock path and said data path passes through.

15. The program storage device of claim 13, wherein:
said worst case timing analysis is based on worst case conditions applied to all voltage islands, the minimum operating voltage applied to said independent voltage islands, and every combination of respective minimum and maximum operating voltages applied to each dependent voltage island; and
said best case timing analysis is based on best case conditions applied to all voltage islands, the maximum operating voltage applied to said independent voltage islands and every combination of respective minimum and maximum operating voltages applied to each dependent voltage island.

16. The program storage device of claim 15, wherein said worst case and said best case conditions are selected from conditions selected from the group consisting of process conditions, temperature conditions and both process and temperature conditions.

17. The program storage device of claim 16, wherein said worst and best case process conditions are a function of the geometry and the doping of devices comprising said integrated circuit and said worst case temperature conditions are maximum operating temperatures of said integrated circuit and said best case temperature conditions are minimum operating temperatures of said integrated circuit.

18. The program storage device of claim 13, said method further including determining an arrival time of a clock signal applied to a start point of said clock path at a common endpoint of said clock and data paths and determining an arrival time of a data signal applied at a start point of said data path at said common endpoint of said clock and data paths for each static timing analysis performed in steps (e) and (f).

19. The program storage device of claim 18, said method further including calculating setup slacks and hold slacks based on said arrival times of said clock and data signals at said common endpoint of said clock and data paths.

20. The program storage device of claim 18, wherein said arrival times of said clock and data signals are based on delays through cells in said clock and data paths respectively.

21. The program storage device of claim 20 wherein said arrival times of said clock and data signals are further based on delays between cells in said clock and data paths respectively.

22. The program storage device of claim 13, wherein said signal path and said data path are determined from a netlist comprising a list of cells in said integrated circuit and a set of nodes interconnecting said cells, each cell having at least one input and one output.

23. The program storage device of claim 13, said method further including;
during step (a) creating a set of clock path voltage island tags for said clock path, said set of clock voltage island tags indicating each voltage island said clock path passes through;
during step (b) creating a set of data path voltage island tags for said data path, said set of data voltage island tags indicating each voltage island said data path passes through; and
during steps (c) and (d) using said set of clock voltage island tags and said set of data voltage island tags to determine which voltage islands of said integrated circuit are independent voltage islands and which voltage islands of said set of integrated circuit are dependent voltage islands by comparing said set of clock voltage island tags and said set of data voltage island tags.

24. The program storage device of claim 13, wherein step (a) includes determining all cells and their interconnections in said clock path and step (b) includes determining all cells and their interconnections in said data path.

25. A computer system comprising a processor, an address/data bus coupled to said processor, and a computer-readable memory unit coupled to communicate with said processor, said memory unit containing instructions that when executed implement a method for analysis of an integrated circuit design having multiple voltage islands, said method comprising the computer implemented steps of:
(a) determining a clock path through said voltage islands;
(b) determining a data path through said voltage islands;
(c) determining which said voltage islands are independent voltage islands;
(d) determining which said voltage islands are dependent voltage islands;
(e) for said data path and said clock path, performing a worst case static timing analysis based on minimum and maximum operating voltages of each independent and dependent voltage island in said data and clock paths; and
(f) for said data path and said clock path, performing a best case static timing analysis based on minimum and maximum operating voltages of each independent and dependent voltage island in said data and clock paths.

26. The computer system of claim 25, wherein:
said independent voltage islands are voltage islands that only one of said clock path or said data path passes through; and
said dependent voltage islands being voltage islands that both said clock path and said data path passes through.

27. The computer system of claim 25, wherein:
said worst case timing analysis is based on worst case conditions applied to all voltage islands, the minimum operating voltage applied to said independent voltage islands, and every combination of respective minimum and maximum operating voltages applied to each dependent voltage island; and
said best case timing analysis is based on best case conditions applied to all voltage islands, the maximum operating voltage applied to said independent voltage islands and every combination of respective minimum and maximum operating voltages applied to each dependent voltage island.

28. The computer system of claim 27, wherein said worst case and said best case conditions are selected from conditions selected from the group consisting of process conditions, temperature conditions and both process and temperature conditions.

29. The computer system of claim 28, wherein said worst and best case process conditions are a function of the geometry and the doping of devices comprising said integrated circuit and said worst case temperature conditions are maximum operating temperatures of said integrated circuit and said best case temperature conditions are minimum operating temperatures of said integrated circuit.

30. The computer system of claim 25, said method further including calculating setup slacks and hold slacks based on arrival times of clock and data signals at a common endpoint of said clock and data paths.

* * * * *

UNITED STATES PATENT AND TRADEMARK OFFICE
CERTIFICATE OF CORRECTION

PATENT NO. : 6,990,645 B2
DATED : January 24, 2006
INVENTOR(S) : Lichtensteiger et al.

Page 1 of 1

It is certified that error appears in the above-identified patent and that said Letters Patent is hereby corrected as shown below:

<u>Column 3,</u>
Line 40, delete "ISOto" and insert -- 150 to --.
Line 58, delete "island 105 second voltage island 117" and insert -- island 105, second voltage island 110 --.

Signed and Sealed this

Eighteenth Day of April, 2006

JON W. DUDAS
*Director of the United States Patent and Trademark Office*